(12) United States Patent
Noebauer (10) Patent No.: US 12,408,374 B2
(45) Date of Patent: Sep. 2, 2025

(54) TRANSISTOR ARRANGEMENT WITH A LOAD TRANSISTOR AND A SENSE TRANSISTOR

(71) Applicant: Infineon Technologies Austria AG, Villach (AT)

(72) Inventor: Gerhard Noebauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/760,559

(22) Filed: Jul. 1, 2024

(65) Prior Publication Data
US 2024/0355923 A1 Oct. 24, 2024

Related U.S. Application Data

(60) Continuation of application No. 18/093,241, filed on Jan. 4, 2023, now Pat. No. 12,062,718, which is a
(Continued)

(30) Foreign Application Priority Data
Jan. 16, 2018 (EP) .................................. 18151843

(51) Int. Cl.
*H10D 30/66* (2025.01)
*G01R 19/00* (2006.01)
(Continued)

(52) U.S. Cl.
CPC ......... *H10D 30/669* (2025.01); *H10D 30/668* (2025.01); *H10D 62/127* (2025.01);
(Continued)

(58) Field of Classification Search
CPC .. H10D 30/669; H10D 30/668; H10D 62/127; H10D 62/154; H10D 62/158;
(Continued)

(56) References Cited

U.S. PATENT DOCUMENTS

| 5,801,573 A | 9/1998 | Kelly et al. |
| 2005/0156605 A1 | 7/2005 | Lee |

(Continued)

FOREIGN PATENT DOCUMENTS

| CN | 101821852 A | 9/2010 |
| CN | 103207303 A | 7/2013 |

(Continued)

*Primary Examiner* — Julia Slutsker
(74) *Attorney, Agent, or Firm* — Murphy, Bilak & Homiller, PLLC (57) ABSTRACT

A transistor arrangement includes a drift and drain region arranged in a semiconductor body and each connected to a drain node, a plurality of load transistor cells each comprising a source region integrated in a first region of the semiconductor body, a plurality of sense transistor cells each comprising a source region integrated in a second region of the semiconductor body, a first source node electrically connected to the source region of each of the plurality of the load transistor cells via a first source conductor, and a second source node electrically connected to the source region of each of the plurality of the sense transistor cells via a second source conductor, a resistance of the second source conductor is different from a resistance of the first source conductor, and the second source conductor comprises an elongated span with a plurality of meanders in which the connection line reverses its direction.

19 Claims, 7 Drawing Sheets

Related U.S. Application Data division of application No. 17/104,216, filed on Nov. 25, 2020, now Pat. No. 11,575,041, which is a division of application No. 16/248,014, filed on Jan. 15, 2019, now Pat. No. 10,872,976.

(51) Int. Cl.
*H10D 62/10* (2025.01)
*H10D 62/13* (2025.01)
*H10D 64/00* (2025.01)

(52) U.S. Cl.
CPC ......... *H10D 62/154* (2025.01); *H10D 62/158* (2025.01); *H10D 64/111* (2025.01); *H10D 64/117* (2025.01); *G01R 19/0092* (2013.01)

(58) Field of Classification Search
CPC ............... H10D 64/111; H10D 64/117; H10D 30/0245; H10D 30/831; H10D 62/605; H10D 12/01; G01R 19/0092; G01R 31/2614; G01R 31/2625; H10F 77/955

See application file for complete search history.

(56) References Cited

U.S. PATENT DOCUMENTS

| | | | |
|---|---|---|---|
| 2014/0015046 A1* | 1/2014 | Thiele | H10D 30/668 |
| | | | 257/334 |
| 2016/0079377 A1* | 3/2016 | Hutzler | H10D 64/112 |
| | | | 257/334 |
| 2016/0181417 A1 | 6/2016 | Kampen et al. | |
| 2017/0093387 A1 | 3/2017 | Zhu et al. | |
| 2017/0154992 A1 | 6/2017 | Willmeroth et al. | |
| 2018/0012982 A1* | 1/2018 | Shinsho | H10D 64/20 |
| 2019/0081624 A1* | 3/2019 | Zhang | H01L 29/7397 |

FOREIGN PATENT DOCUMENTS

| | | |
|---|---|---|
| CN | 104297569 A | 1/2015 |
| CN | 105281730 A | 1/2016 |
| CN | 107579062 A | 1/2018 |
| GB | 0412179 | 6/2004 |
| JP | 2000299627 A | 10/2000 |
| JP | 2003243656 A | 8/2003 |

\* cited by examiner

TRANSISTOR ARRANGEMENT WITH A LOAD TRANSISTOR AND A SENSE TRANSISTOR

RELATED APPLICATIONS

The instant application is a divisional of and claims priority to U.S. application Ser. No. 17/104,216 filed on Nov. 25, 2020, which in turn is a divisional of and claims priority to U.S. application Ser. No. 16/248,014 filed on Jan. 15, 2019, the content of which is incorporated by reference in its entirety.

TECHNICAL FIELD

This disclosure in general relates to a transistor arrangement with a load transistor and a sense transistor.

BACKGROUND

Transistors such as MOSFETs (Metal Oxide Semiconductor Field-Effect Transistors) are widely used as electronic switches in various types of electronic circuits. In many applications it is desirable to measure the current flowing through the transistor, which may be referred to as load transistor.

One way of measuring a load current provided by the transistor (which may be referred to as load transistor) to the load is using a sense transistor. The sense transistor is connected to the load transistor and driven such that it is operated in the same operating point as the load transistor. Ideally, a sense current through the sense transistor is proportional to the load current, wherein a proportionality factor is given by a ratio between a size of the load transistor and a size of the sense transistor. The load transistor and the sense transistor may be implemented in a common semiconductor body and each include a plurality of transistor cells. The size ratio is then equivalent to a ratio between the number of transistor cells of the sense transistor and the number of transistor cells of the load transistor.

Due to parasitic effects, however, a proportionality factor between the sense current and the load current, which is referred to as current ratio in the following, does not exactly match the size ratio. In particular, these parasitic effects may have the effect that a deviation of the current ratio from the size ratio increases as the size of the sense transistor decreases relative to the size of the load transistor. On the other hand, it may be desirable to implement the sense transistor as small as possible in order to reduce losses associated with measuring the current.

It is therefore desirable to provide a transistor arrangement with a load transistor and a sense transistor which enables precisely measuring a load current in the load transistor using the sense transistor.

SUMMARY

One example relates to a transistor arrangement. The transistor arrangement includes a drift and drain region arranged in a semiconductor body and connected to a drain node, a plurality of load transistor cells each including a source region integrated in a first region of the semiconductor body, and a plurality of sense transistor cells each including a source region integrated in a second region of the semiconductor body. A first source node is electrically connected to the source region of each of the plurality of load transistor cells via a first source conductor having a first area specific resistance, and a second source node is electrically connected to the source region of each of the plurality of sense transistor cells via a second source conductor having a second area specific resistance, wherein the area specific resistance of the second source conductor is greater than the area specific resistance of the first source conductor.

Another example relates to a method. The method includes detecting a first current flowing between a drain node and a first source node of a transistor arrangement, wherein detecting the first current includes measuring a second current flowing between the drain node and a second source node of the transistor arrangement. The transistor arrangement includes a drift and drain region arranged in a semiconductor body and connected to a drain node, a plurality of load transistor cells each including a source region and a body region integrated in a first region of the semiconductor body, and a plurality of sense transistor cells each including a source region and a body region integrated in a second region of the semiconductor body. Further, the transistor arrangement includes a first source conductor having a first area specific resistance and electrically connecting the first source node to the source region of each of the plurality of load transistor cells, and a second source conductor having a second area specific resistance and electrically connecting the second source node to the source region of each of the plurality of sense transistor cells, wherein the area specific resistance of the second source conductor is greater than the area specific resistance of the first source conductor.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
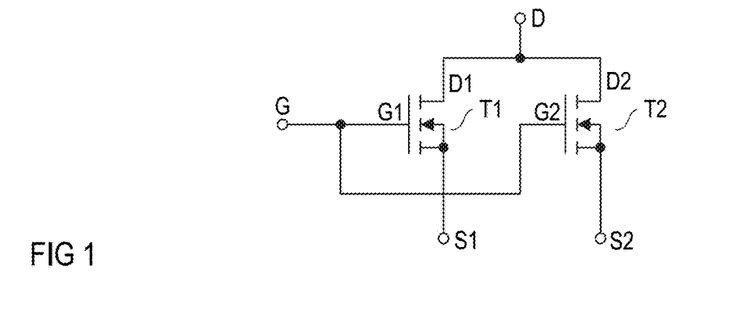
FIG. 1 shows a circuit diagram of a transistor arrangement with a load transistor and a sense transistor.

FIG. 1 shows a circuit diagram of one example of a transistor arrangement that includes a first transistor T1 and a second transistor device T2. In this type of transistor arrangement, the first transistor T1 may be used as an electronic switch that switches a current received by a load (not shown in FIG. 1), and the second transistor T2 may be used to sense the current flowing through the load transistor device. Thus, the first transistor T1 may also be referred to as load transistor and the second transistor T2 may also be referred to as sense transistor. Each of the first transistor T1 and the second transistor T2 has a first load node S1, S2, a second load node D1, D2, and a control node G1, G2. The control node G1 of the first transistor T1 and the control node G2 of the second transistor T2 are electrically connected so that the first transistor T1 and the second transistor T2 have a common control node G. Further, the second load node D1 of the first transistor T1 and the second load node D2 of the second transistor T2 are electrically connected so that the first transistor T1 and the second transistor T2 have a common second load node D.

According to one example, the first transistor T1 and the second transistor T2 are transistors of the same type. Just for the purpose of illustration, each of the first transistor T1 and the second transistor T2 is a MOSFET (Metal Oxide Semiconductor Field-Effect Transistor), in particular, an n-type enhancement MOSFET, as shown in FIG. 1. This, however, is only an example. Any other type of MOSFET or any other type of transistor device may be used to implement the first transistor T1 and the second transistor T2. When the transistors T1, T2 are MOSFETs, as shown in FIG. 1, the control node G1, G2 may also be referred to as gate node, the first load node S1, S2 may also be referred to as source node, and the second load node D1, D2 may also referred to as drain node.

Referring to the above, a transistor arrangement of the type shown in FIG. 1 may be used to supply a current to a load and, at the same time, measure the current supplied to the load. This is illustrated in FIG. 2, which shows one example of an electronic circuit that includes a transistor arrangement of the type shown in FIG. 1 and a load Z.

Figure 2:
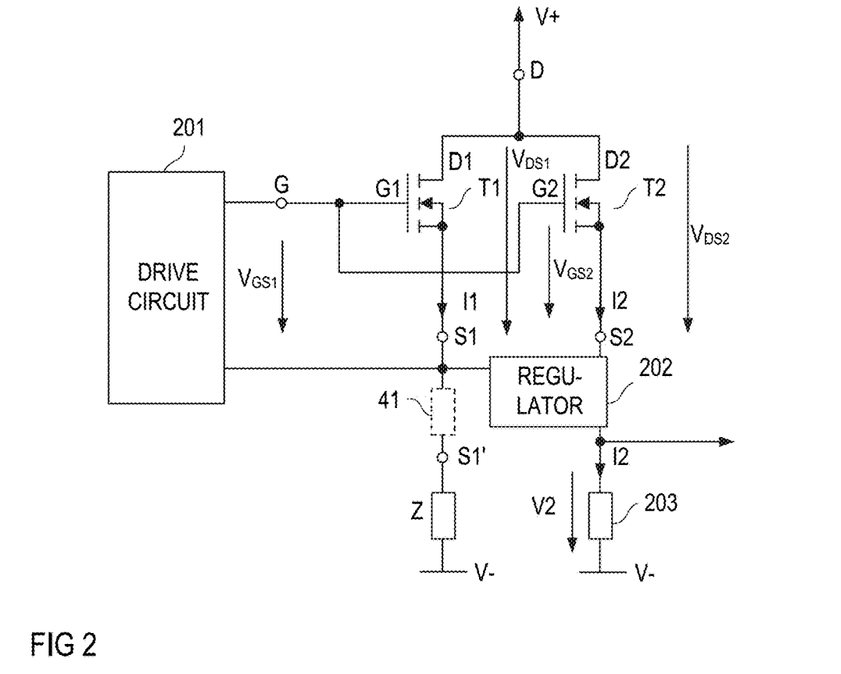
FIG. 2 shows a circuit diagram that illustrates one possible application of a transistor arrangement of the type shown in FIG. 1.

In the electronic circuit shown in FIG. 2, the transistor arrangement is configured to supply a current I1, which may be referred to as load current, to a load Z. For this, a load path of the first transistor device T1, which is a current path between the first load node S1 and the second load node D1 is connected in series with the load Z, wherein the series circuit with the first transistor device T1 and the load Z is connected between a first supply node and a second supply node. A first supply potential V+ is available at the first supply node and a second supply potential V− different from the first supply potential is available at the second supply node. The first supply potential may be a positive supply potential and the second supply potential may be a negative supply potential or ground potential. A drive circuit 201 is connected to a drive input of the first transistor T1 and configured to provide a drive voltage $V_{GS1}$ to the first transistor T1. The "drive input" of the first transistor T1 includes the common control node G and the first load node S1 of the first transistor. Based on the drive voltage $V_{GS1}$, the first transistor device T1 switches on or off. More specifically, the first transistor T1 switches on, to be in an on-state, when the drive voltage $V_{GS1}$ is higher than a threshold voltage of the first transistor T1 and switches off, to be in an off-state, when the drive voltage $V_{GS1}$ is lower than the threshold voltage of the first transistor T1. In the on-state, the first transistor T1 conducts a current so that a current level of the load current I1 is greater than zero. In the off-state, the first transistor T1 blocks, so that the current level of the load current I1 is zero.

The load Z may be any type of electric load or electric network. According to one example, the first transistor T1 and the load Z form a switched-mode voltage converter such as, for example, a buck converter, a boost converter, a flyback converter, or the like.

Referring to FIG. 2, the electronic circuit further includes a regulator 202 that is coupled to the first load node S1 of the first transistor T1 and the first load node S2 of the second transistor T2. The regulator 202 is configured to regulate an electrical potential at the first load node S2 of the second transistor device T2 such that this potential at least approximately equals a potential at the first load node S1 of the first transistor T1. When the electrical potentials at the first load nodes S1, S2 are equal, the first transistor T1 and the second transistor T2 are in the same operating point. That is, the drive voltage $V_{GS1}$ received by the first transistor T1 equals a second drive voltage $V_{GS2}$ received by the second transistor device T2 and a load path voltage $V_{DS1}$ between the second load node D1 and the first load node S1 of the first transistor device T1 equals a second load path voltage $V_{DS2}$ between the second load node D2 and the first load node S2 of the second transistor device T2. In the following, "common load path voltage $V_{DS}$" denotes the load path voltage of both transistors T1, T2 when the first and second load path voltages $V_{DS1}$, $V_{DS2}$ are equal, that is, $V_{DS}=V_{DS1}=V_{DS2}$. Further, "common drive voltage $V_{GS}$" denotes the drive voltage of both transistors T1, T2 when the first and second drive voltages $V_{GS1}$, $V_{GS2}$ are equal, that is, $V_{GS}=V_{GS1}=V_{GS2}$.

Figure 3:
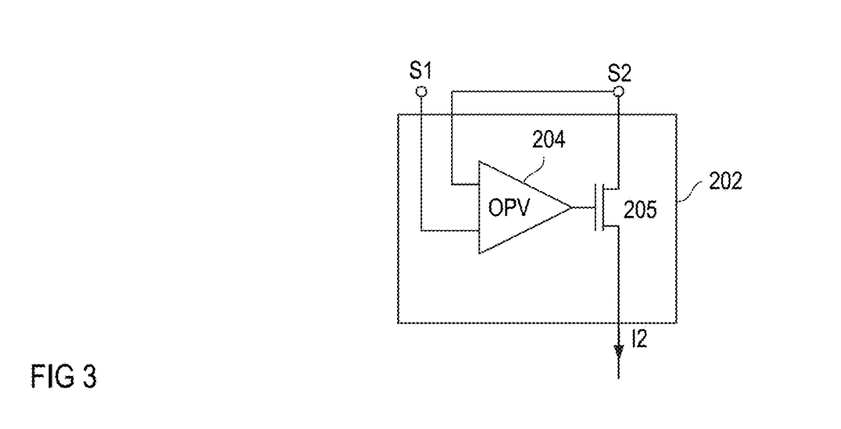
FIG. 3 shows one example of a regulator shown in FIG. 2.

FIG. 3 shows one example of the regulator 202. In this example, the regulator 202 includes an operational amplifier 204 and a variable resistor 205. A first input of the operational amplifier 204 is connected to the first load node S1 of the first transistor device T1 and a second input of the operational amplifier 204 is connected to the first load node S2 of the second transistor device T2. The variable resistor 205 is connected in series with the load path of the second transistor device T2 and controlled by the operational amplifier 204. Just for the purpose of illustration, the variable resistor 205 is a MOSFET in the example shown in FIG. 3. The regulator 202 shown in FIG. 3 is configured to adjust a resistance of the variable resistor 205 such that the electrical potential at the first load node S2 of the second transistor device T2 essentially equals the electrical potential at the first load node S1 of the first transistor device T1.

When the second transistor T2 is operated in the same operating point as the first transistor T1 a current I2 through the second transistor device T2 is a representation of the load current I1 through the first transistor device T1 and the load Z. The second current I2 can therefore be used to measure the load current I1 and will be referred to as sense current in following. The sense current I2 may be measured in various ways. Just for the purpose of illustration, a resistor 203, which may be referred to as sense resistor is connected in series with the second transistor device T2. In this example, a voltage V2 across the sense resistor 203 represents the sense current I2.

Referring to FIG. 2, the regulator 201 and the load Z are connected to the first load node S1 of the load transistor T1. According to one example, the load Z is not directly connected to the first load node S1, but is connected to a further load node S1' which is connected to the first load node S1 via a conductor. This conductor is represented by a resistor 41 in the example shown in FIG. 2. According to one example, the load transistor T1, the sense transistor T2, and the regulator 202 are arranged in a common housing (which is not illustrated in FIG. 2). In this case, the further load node S1' is accessible outside the housing and may be referred to as external load node. The first load node S1 is not accessible outside the housing and may be referred to as internal node.

The drive voltage $V_{GS1}$ provided by the drive circuit 201 may be applied between the common gate node G1 and the internal load node S1 or between the common gate node G1 and the external load node S1' of the load transistor. In the latter case, the voltage between the common gate node and the internal load node S1 is smaller than the drive voltage $V_{GS1}$ provided by the drive circuit 201 and is given by the drive voltage $V_{GS1}$ minus a voltage V41 across the conductor 41, wherein this voltage is given by a resistance R41 of the resistor 41 multiplied with the load current I1. In each case, the regulator 202 regulates the voltage $V_{GS2}$ between the common gate node G and the first load node S2 of the sense transistor T2 such that this voltage equals the voltage between the common gate node G and the internal load node S1 of the load transistor T1.

The first transistor T1 and the second device T2 can be designed such that the sense current I2 is much smaller than the load current I1 when both transistors are operated in the same operating point. This may help to minimize losses that are associated with measuring the load current I1. A ratio or proportionality factor between the load current I1 and the sense current I2 is greater than 10000 ($10^4$), greater than 30000 ($3\times10^4$), or even greater than 50000 ($5\times10^4$). This ratio is referred to as current proportionality factor $k_{ILIS}$ in the following, that is, $$k_{ILIS} = \frac{I1}{I2}.$$

In an ideal case, the proportionality factor between the load current I1 and the sense current I2 is predefined, known, and independent of the operating point of the first transistor T1 and the second transistor T2, so that in each operating point the load current I1 is given by the sense current I2 multiplied with the predefined and known proportionality factor. However, designing the second transistor T2 such that (a) the sense current I2 is small, and (b) the proportionality factor is great, such as greater than $10^4$, may cause the proportionality factor to vary as the operating point varies. This is explained in the following. A variation of the operating point may be caused by a variation of the common drive voltage $V_{GS}$ or the common load path voltage $V_{DS}$.

Figure 4:
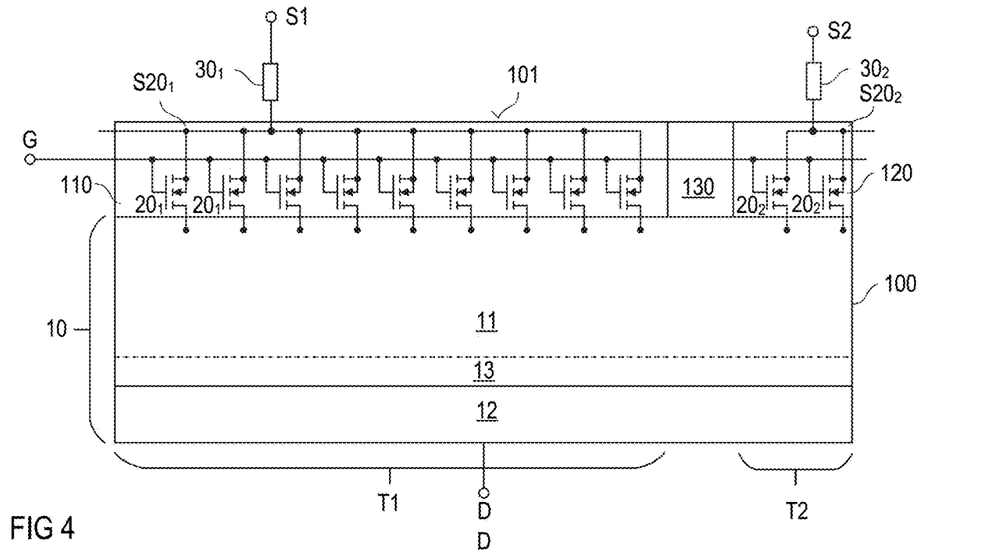
FIG. 4 illustrates how active regions of the load transistor and the sense transistor may be integrated in a semiconductor body.

FIG. 4 schematically illustrates one example of how the transistor arrangement with the first transistor T1 and the second transistor T2 may be implemented using a common semiconductor body 100. FIG. 4 illustrates a vertical cross sectional view of one section of the semiconductor body 100. In this section, active regions of the first transistor T1 and the second transistor T2 are integrated. Just for the purpose of illustration it is assumed that each of the first transistor T1 and the second transistor T2 is a MOSFET. Thus the common second load node D is referred to as common drain node, the common control node G is referred to as common gate node. Further, the first load node S1 of the first transistor T1 is referred to as first source node and the first load node S2 of the second transistor T2 is referred to as second source node.

Referring to FIG. 4, the transistor arrangement includes a drift and drain region 10 that is arranged in the semiconductor body 100 and connected to the common drain node D. A plurality of load transistor cells 201 is integrated in a first region 110 that adjoins the drift and drain region 10, and a plurality of sense transistor cells 202 is integrated in a second region 120 that adjoins the drift and drain region 10. In FIG. 4, the load transistor cells 201 are schematically illustrated by circuit symbols of transistors, and the sense transistor cells 202 are schematically represented by circuit symbols of transistors. Each of the load transistor cells 201 includes a source region integrated in the first region 110, and each of the sense transistor cells 202 includes a source region integrated in the second region 120. In FIG. 4, these source regions are not explicitly shown, but are represented by source nodes S201, S202 of the circuit symbols representing the load transistor cells 201 and the sense transistor cells 202. The source region S201 of each of the load transistor cells 201 is electrically connected to the first source node S1 via a first source conductor 301, and the source region S202 of each of the plurality of sense transistor cells 202 is electrically connected to the second source node S2 via a second source conductor 302. Each of the first source conductor 301 and the second source conductor 302 has an area specific resistance, wherein the area specific resistance of the second source conductor 302 is greater than the area specific resistance of the first source conductor 301. The area specific resistance of the first source conductor 301 is given by an electrical resistance R301 of the first source conductor 301 multiplied with the size A1 of an area of the first region 110. The area specific resistance of the second source conductor 302 is given by an electrical resistance R302 of the second source conductor 302 multiplied with a size of an area of the second region 120. This is explained in further detail herein below.

In the transistor arrangement shown in FIG. 4, the load transistor cells $20_1$ and the first source conductor $30_1$ are part of the load transistor T1. Further, the sense transistor cells $20_2$ and the second source conductor $30_2$ are part of the sense transistor T2. The drift and drain region 10 is part of both the load transistor T1 and the sense transistor T2.

Referring to FIG. 4, the drift and drain region 10 may include a drift region 11 and a drain region 12. In this case, the drift region adjoins the first and second regions 110, 120 and is arranged between the first and second regions 110, 120 and the drain region. The drift region 11 is more lowly doped than the drain region 12 and may adjoin the drain region 12. Optionally, a field-stop region 13, which is more highly doped than the drift region 11 and more lowly doped than the drain region 12, may be arranged between the drift region 11 and the drain region 12. When the load transistor T1 and the sense transistor T2 are n-type MOSFETs the drain region 12, the drift region 11, and the optional field-stop region 13 are n-doped. When the load transistor T1 and the sense transistor T2 are p-type MOSFETs, the drain region 12, the drift region 11 and the optional field-stop regions 13, are p-doped. A doping concentration of the drain region 12 is, for example, in a range of between 1 E19 cm$^{-3}$ and 1 E21 cm$^{-3}$. A doping concentration of the drift region 13 is, for example, between 1 E15 cm$^{-3}$ and 5 E17 cm$^{-3}$.

Each of the load transistor T1 and the sense transistor T2 has an on-resistance, which is the electrical resistance between the common drain node D and the respective source node S1, S2. In the following, $R_{ON1}$ denotes the on-resistance of the load transistor T1 and $R_{ON2}$ denotes the on-resistance of the sense transistor T2.

In accordance with Ohm's law, the load current I1 is given by the quotient of the common load path voltage $V_{DS}$ and the on-resistance $R_{ON1}$ of the load transistor T1, $$I1 = \frac{V_{DS}}{R_{ON1}}, \tag{1a}$$

and the sense current I2 is given by the quotient of the common load path voltage $V_{DS}$ and the on-resistance of the sense transistor $R_{ON2}$, $$I2 = \frac{V_{DS}}{R_{ON2}}. \tag{1b}$$

Based on equations (1a) and (1b) it can be shown that the current proportionality factor $k_{ILIS}$ is dependent on the on-resistances $R_{ON1}$, $R_{ON2}$ as follows:

$$k_{ILIS} = \frac{I1}{I2} = \frac{R_{ON2}}{R_{ON1}}. \tag{2}$$

Figure 5:
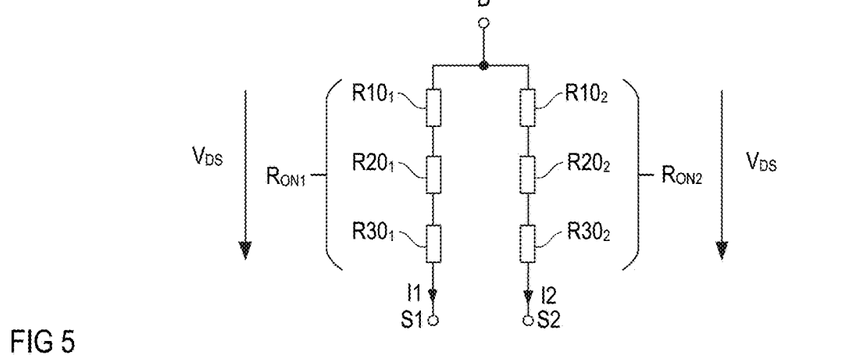
FIG. 5 shows a circuit diagram of the transistor arrangement illustrated in FIG. 4 in an on-state of the transistor arrangement.

Each of these on-resistances $R_{ON1}$, $R_{ON2}$ is comprised of several resistances of different regions or structures in the transistor arrangement. This is explained with reference to FIG. 5, which shows the electrical circuit diagram of a transistor arrangement of the type shown in FIG. 4 in the on-state of the transistor arrangement (that is, in the on-state of the load transistor T1 and the sense transistor T2). Referring to FIG. 5, the on-resistance $R_{ON1}$ of the load transistor T1 includes a series circuit with a drift and drain region resistance $R10_1$, a transistor cell resistance $R20_1$, and a source conductor resistance $R30_1$. Equivalently, the on-resistance $R_{ON2}$ of the sense transistor T2 includes a drift and drain region resistance $R10_2$, a transistor cell resistance $R20_2$, and a source conductor resistance $R30_2$. The source conductor resistance $R30_1$ of the load transistor T1 is the electrical resistance of the source conductor $30_1$ between the first source node S1 and the load transistor cells $20_1$. Equivalently, the source conductor resistance $R30_2$ of the sense transistor T2 is the electrical resistance of the source conductor $30_2$ between the second source node S2 and the sense transistor cells $20_2$. The transistor cell resistance $R20_1$ of the load transistor T1 is the electrical resistance of the parallel circuit with the plurality of load transistor cells $20_1$ in the on-state of the load transistor cells $20_1$. Equivalently, the transistor cell resistance $R20_2$ of the sense transistor cells $20_2$ is the electrical resistance of the parallel circuit with the plurality of sense transistor cells $20_2$ in the on-state. The drift and drain region resistance $R10_1$ of the load transistor T1 is the electrical resistance of the drift and drain region 10 between the parallel circuit with the plurality of load transistor cells $20_1$ in the first region 110 and the drain node D. Equivalently, the drift and drain region resistance $R10_2$ of the sense transistor T2 is the electrical resistance of the drift and drain region 10 between the parallel circuit with the plurality of sense transistor cells $20_2$ in the second region 120 and the drain node D.

The transistor cell resistances $R20_1$, $R20_2$ are dependent on the operating state and the number of transistor cells. That is, the transistor cell resistance $R20_1$ of the load transistor T1 is dependent on the common drive voltage $V_{GS}$ received by the load transistor T1 and the number of load transistor cells $20_1$ integrated in the first region 110 and connected in parallel, and the transistor cell resistance $R20_2$ of the sense transistor T2 is dependent on the common drive voltage $V_{GS}$ received by the sense transistor T2 and the number of sense transistor cells $20_2$ integrated in the second region 120 and connected in parallel. According to one example, the load transistor cells $20_1$ and the sense transistor cells $20_2$ are implemented in the same fashion such that the size of the first area 110 is proportional to the number of load transistor cells $20_1$ integrated therein and the size of the second area 120 is proportional to the number of sense transistor cells $20_2$ integrated therein. In this case, when the load transistor T1 and the sense transistor T2 are operated in the same operating point (receive the same drive voltage $V_{GS}=V_{GS1}=V_{GS2}$) the transistor cell resistance $R20_1$ of the load transistor T1 is proportional to the transistor cell resistance $R20_2$ of the sense transistor T2, with a proportionality factor being given by a ratio between a size A1 of the first region 110 and a size A2 of the second region 120, so that $$\frac{R20_1}{R20_2} = \frac{A2}{A1}. \tag{3}$$

In the following, $A1 \cdot R20_1$ denotes an area specific resistance of the load transistor cells $20_1$, which is the electrical resistance of the parallel circuit with the load transistor cells $20_1$ in relation to the size A1 of the active region 110. Equivalently, $A2 \cdot R20_2$ denotes an area specific resistance of the sense transistor cells $20_2$, which is the electrical resistance of the parallel circuit with the sense transistor cells $20_2$ in relation to the size A2 of the second region 120. Using equation (3) it can be shown that these area specific resistances are equal, that is, $A1 \cdot R20_1 = A2 \cdot R20_2$. It should be noted that due to imperfections and variations in the manufacturing process of the transistor arrangement these area specific resistances may not exactly be equal. According to one example, "equal area specific resistances" as used herein include area specific resistances that deviate from one another by less than +/−2% of an average of the area specific resistances.

Referring to FIG. 4, an inactive region 130 is arranged between the first region 110 and the second region 120. The inactive region 130 does not include active transistor cells so that no current flows in the inactive region 130. However, a current from the load transistor cells 20₁ integrated in the first region 110 and from the sense transistor cells 20₂ integrated in the second region 120 can flow in the drift and drain region 10 below the inactive region 130. Thus, a cross sectional area of the drift and drain region 10 in which the load current I1 from the load transistor cells 20₁ flows through the drift and drain region 10 is greater than the size A1 of the first region 110. Equivalently, a cross sectional area of the drift and drain region 10 in which the sense current I2 from the sense transistor cells 20₂ flows through the drift and drain region 10 is greater than the size A2 of the second region 120. Based on this, a ratio between the drift and drain region resistance R10₁ of the load transistor T1 and the drift and drain region resistance R10₂ of the sense transistor T2 can be expressed as $$\frac{R10_1}{R10_2} = \frac{A2 + \Delta A2}{A1 + \Delta A1}, \tag{4}$$

where ΔA1 denotes the size of an additional area where the load current I1 flows below the inactive region. This inactive region may include the inactive region 130 that is shown in FIG. 4 and is arranged between the first region 110 and the second region 120 and other inactive regions (not shown in FIG. 4) that adjoin the first region 110 in lateral (horizontal) directions of the semiconductor body 100. "Lateral directions" are directions perpendicular to a first surface 101 of the semiconductor body 100. Equivalently, ΔA2 denotes the size of an additional area of the drift and drain region 10 below the inactive region where the sense current may flow. This inactive region may include the inactive region 130 below the first region 110 and the second region 120 shown in FIG. 4 and other inactive regions adjoining the second region 102 in lateral (horizontal) directions.

The effect that the load current I1 does not only flow below the first region 110 through the drift and drain region 10 and that the sense current I2 does not only flow below the second region 120 through the drift and drain region 10 may be referred to as current spreading.

The size of the additional areas ΔA1, ΔA2 is not linearly dependent on the sizes A1, A2 of the first region 110 and the second region 120. (In a first approximation, ΔA1 can be considered to be proportional to a square root of A1, and ΔA2 can be considered to be proportional to the square root of A2). Moreover, it can be shown that a ratio between the size of the additional area (ΔA1, ΔA2 in the example explained above) and the size of the corresponding transistor cell region (110, 120 in the example explained above) increases as the size of the transistor cell region decreases. Based on this and as the size of the first (transistor cell) region 110 is much greater than the size of the second (transistor) cell region 120, a ratio between the size of the additional area ΔA2 and the size A2 of the second region 120 is greater than a ratio between the size of the additional area ΔA1 and the size A1 of the first region 110, that is, $$\frac{\Delta A2}{A2} > \frac{\Delta A1}{A1}. \tag{5}$$

Based on equations (4) and (5) it can be shown that an area specific drift and drain region resistance A1·R10₁ of the load transistor T1 is greater than an area specific drift and drain resistance A2·R10₂ of the sense transistor T2, $$A1 \cdot R10_1 > A2 \cdot R10_2. \tag{6}$$

The smaller the size A2 of the second region 120 relative to the size of the first region, the greater the difference between the area specific drift and drain region resistance A1·R10₁ of the load transistor T1 and the area specific drift and drain region resistance A2·R10₂ of the sense transistor T2. Further, this difference increases as a size of the inactive region 130 increases relative to the size of the second region 120. According to one example, a shortest distance between the first region 110 and the second region 120 is greater than 0.5 times the square route of the size A2 of the second region 120, that is, $$d1 > 0.5\sqrt{A2}, \tag{7}$$

where d1 denotes the shortest distance between the first region 110 and the second region 120.

Referring to the above, the transistor cell resistances R20₁, R20₂ are dependent on the drive voltage V_{GS}. The drift and drain region resistances R10₁, R10₂ and the source conductor resistances, however, are widely independent of the drive voltage V_{GS}. That is, each of the first and second on-resistance R_{ON1}, R_{ON2} includes a drive voltage dependent portion and a drive voltage independent portion. It can be shown that the current proportionality factor k_{ILIS} as given by equation (1) is widely independent of the drive voltage Vas when this current proportionality factor k_{ILIS} essentially equals the ratio between the drive voltage dependent portions, which is the ratio between the transistor cell resistances R20₁, R20₂. That is, the current proportionality factor k_{ILIS} is independent of the drive voltage V_{GS} if the following applies:

$$k_{ILIS} = \frac{R_{ON2}}{R_{ON1}} = \frac{A_1}{A_2}, \text{ or} \tag{8}$$

$$A1 \cdot R_{ON1} = A2 \cdot R_{ON2}, \tag{9}$$

where A1·R_{ON1} denotes an area specific on-resistance of the load transistor T1 and A2·R_{ON2} denotes an area specific on-resistance of the sense transistor T2. A1·R_{ON1} will also be referred to as first area specific on-resistance in the following and A2·R_{ON2} and will also be referred to as second area specific on-resistance in the following. The more these area specific on-resistances, at a given drive voltage, deviate from one another, the higher is the dependency of the current proportionality factor k_{ILIS} on the drive voltage Vas. By virtue of the current spreading effect explained above, portions of the area specific on-resistance resulting from the transistor cell resistances R20₁, R20₂ and the drift and drain region resistances R10₁, R10₂ are not equal, that is, $$A1 \cdot (R20_1 + R10_1) \neq A2 \cdot (R20_2 + R10_2), \tag{10}$$

wherein the more a ratio $\Delta A_2/\Delta A_1$ between the sizes of the additional areas $\Delta A2$, $\Delta A1$ deviates from the ratio $A_2/A_1$ of the sizes A2, A1 of the first and second regions 110, 120, the greater a difference between these portions.

Figure 6:
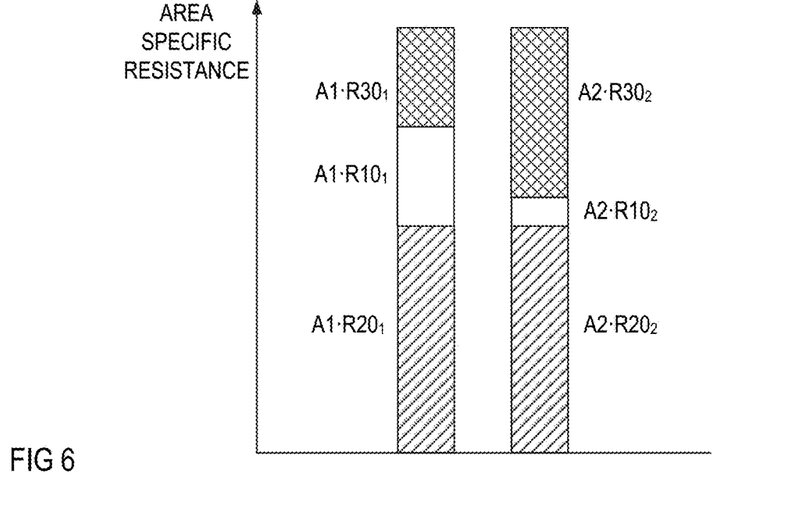
FIG. 6 illustrates how area specific resistances of the load transistor and the sense transistor are composed of area specific resistances of different sections of the load transistor and the sense transistor.

Equation (10) is visualized in FIG. 6 that illustrates the area specific transistor cells resistances $A1 \cdot R20_1$, $A2 \cdot R20_2$ and the area specific drift and drain region resistances $A1 \cdot R10_1$, $A2 \cdot R10_2$. As illustrated in FIG. 6, and as explained above, the area specific drift and drain region resistance $A2 \cdot R10_2$ of the sense transistor T2 is smaller than the area specific drift and drain region resistance $A1 \cdot R10_1$ of the load transistor T1. If the on-resistances $R_{ON1}$, $R_{ON2}$ would only be comprised of the transistor cell resistances $R20_1$, $R20_2$ and the drift and drain region resistances $R10_1$, $R10_2$ the current proportionality factor would not only be different from the size ratio A1/A2, but, even more important, be dependent on the drive voltage. This is because the transistor cell resistances $R20_1$, $R20_2$ are dependent on the drive voltage $V_{GS}$ and the drift and drain region resistances $R10_1$, $R10_2$ are widely independent on the drive voltage $V_{GS}$.

In order to at least partially compensate the dependency of the proportionality factor $k_{ILIS}$ on the drive voltage $V_{GS}$ the resistances $R30_1$, $R30_2$ of the source conductors $30_1$, $30_2$ are suitably designed. In particular, the source conductor resistance $R30_2$ of the sense transistor T2 is designed such that the area specific on-resistance $A1 \cdot R_{ON1}$ of the load transistor T1 and the area specific on-resistance $A2 \cdot R_{ON2}$ of the sense transistor T2 converge in order to at least reduce a dependency of the current proportionality factor $k_{ILIS}$ on the drive voltage $V_{GS}$. More specifically, the second source conductor $30_2$ is designed such that an area specific resistance $A2 \cdot R30_2$ of the second source conductor $30_2$, which is the resistance $R30_2$ of the second source conductor $30_2$ in relation to the area A2 of the second region 120, is greater than an area specific source conductor resistance $A1 \cdot R30_1$ of the first source conductor $30_1$, which is the resistance $R30_1$ of the first source conductor $30_1$ in relation to the size A1 of the first region 110.

Just for the purpose of illustration, in the example shown in FIG. 6, the area specific source conductor resistances $A1 \cdot R30_1$, $A2 \cdot R30_2$ are selected such that the area specific on-resistances $A1 \cdot R_{ON1}$, $A2 \cdot R_{ON2}$ of the load transistor T1 and the sense transistor T2 are equal. This represents the ideal case in which the current proportionality factor $k_{ILIS}$ can be considered to be independent of the drive voltage $V_{GS}$. This, however, is only an example. An improvement in view of reducing the dependency of the current proportionality factor $k_{ILIS}$ on the drive voltage $V_{GS}$ is already obtained by simply making the area specific resistance $A2 \cdot R30_2$ of the second source conductor $30_2$ greater than the area specific source conductor resistance $A1 \cdot R30_1$ of the first source conductor $30_1$.

According to one example, the area specific resistance $A2 \cdot R30_2$ of the second source conductor $30_2$ is designed such that it is adapted to the area specific resistance $A1 \cdot R30_1$ of the first source conductor $30_1$ and the area specific drift and drain resistances $A1 \cdot R10_1$, $A2 \cdot R10_2$ of the of the load transistor T1 and the sense transistor T2 as follows:

$$R30_2 \cdot A2 = c \cdot (R10_1 \cdot A1 - R10_2 \cdot A2) + R30_1 \cdot A1, \quad (11)$$

where c is a constant selected from between 0.5 and 1.5. According to another example, c is selected from between 0.8 and 1.2. If c=1, the area specific on-resistances $A1 \cdot R_{ON1}$, $A2 \cdot R_{ON2}$ are equal.

Figure 7A:
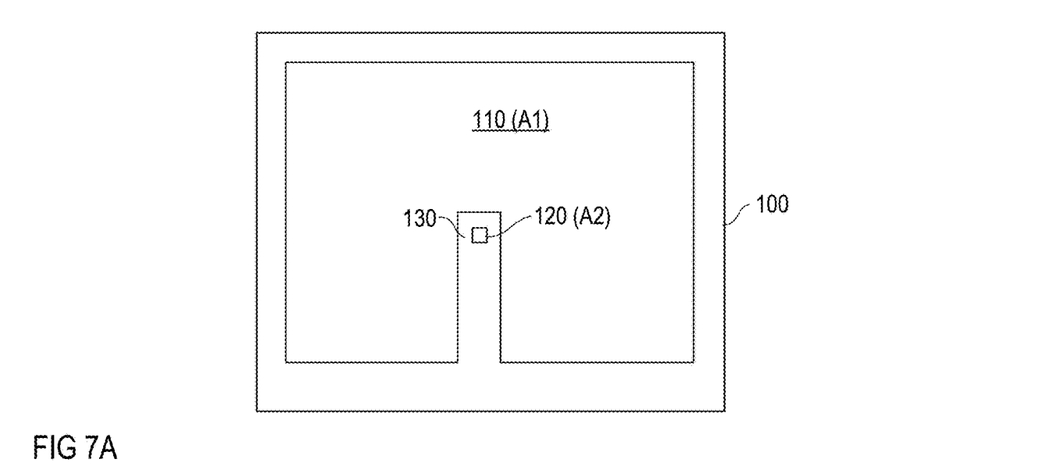
FIGS. 7A to 7C show different horizontal cross sectional views that illustrates how a first active region with load transistor cells and a second active region with sense transistor cells may be arranged in a semiconductor body.

FIG. 7A schematically illustrates a top view of the semiconductor body 100 in order to illustrate how the first region 110 and the second region 120 may be arranged in the semiconductor body 100. In this example, the first region 110 and the second region 120 are implemented such that the second region 120 is essentially rectangular and the first region 110 is adjacent the second region 120 on three sides of the second region 120. The inactive region 130 surrounds the first region 110 and, as explained with reference to FIG. 5, separates the second region 120 from the first region 110.

Figure 7B:
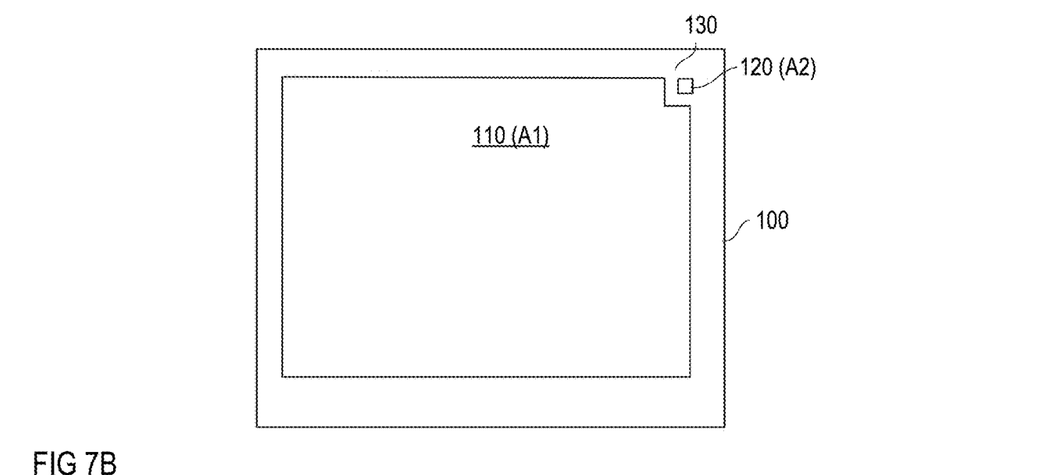
Figure 7C:
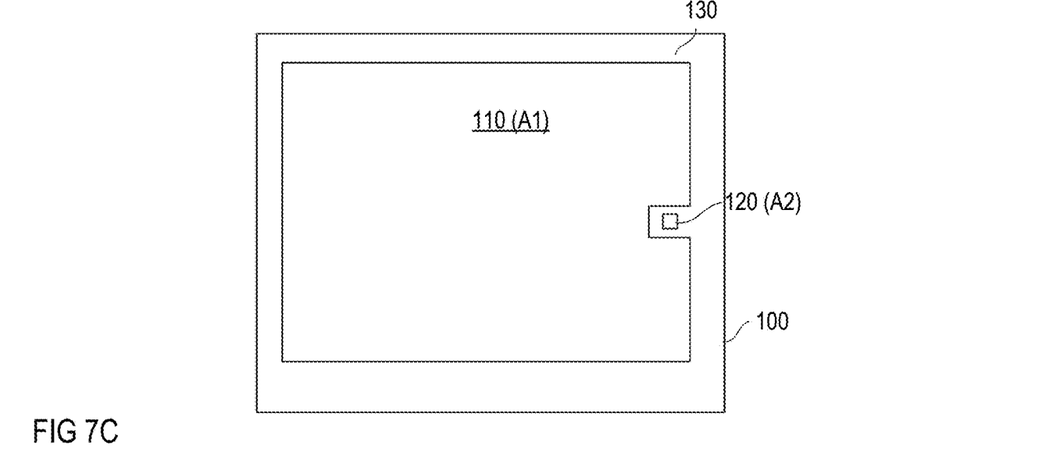

The arrangement shown in FIG. 7A is only one example. According to another examples shown in FIGS. 7B and 7C, the second region may be arranged in a corner or in a region of an outer edge of the first region 110.

Figure 8A:
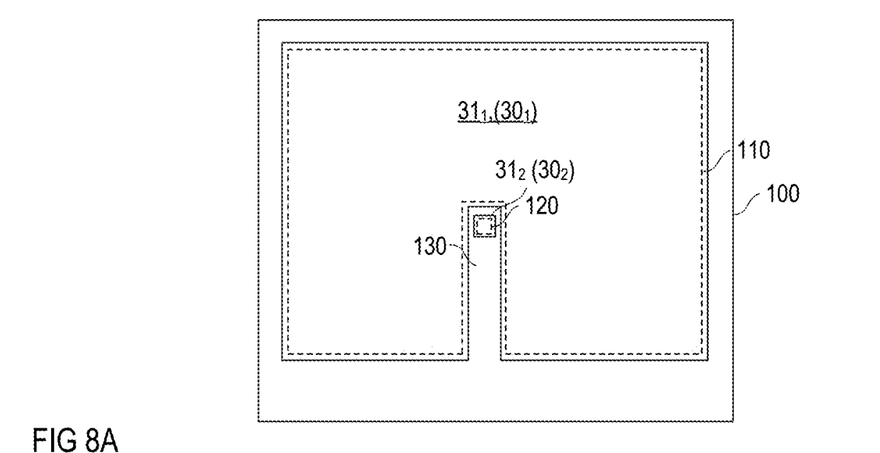
FIGS. 8A and 8B show a top view of a first source metallization and a second source metallization in an arrangement of the type shown in FIG. 7, and a top view of a first source pad and a second source pad in an arrangement of the type shown in FIG. 8.
Figure 8B:
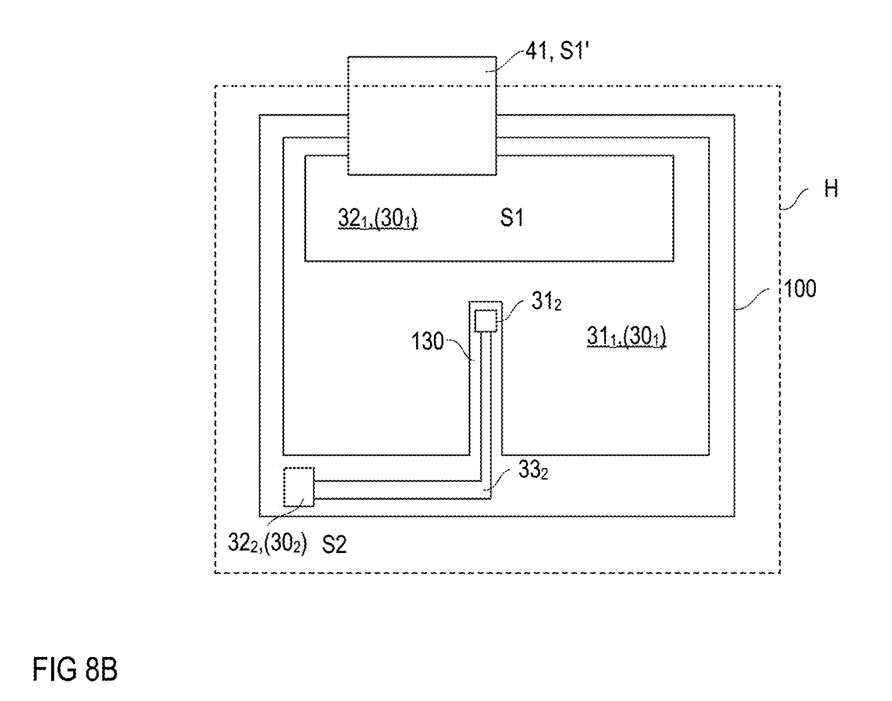

FIGS. 8A and 8B illustrate one example of how the first source conductor $30_1$ and the second source conductor $30_2$ may be implemented. In this example, each of the first source conductor $30_1$ and the second source conductor $30_2$ includes a metallization layer $31_1$, $31_2$ on the first region 110 and the second region 120, respectively. A top view of these metallization layers $31_1$, $31_2$ is shown in FIG. 8A. The first region 110 and the second region 120 below these metallization layers $31_1$, $31_2$ are illustrated in dashed lines in FIG. 8A. According to one example, the metallization layers $31_1$, $31_2$ include at least one of aluminium (Al), copper (Cu), titanium (Ti), gold (Au), silver (Ag), or the like.

Referring to FIG. 8B, each of the source conductors $30_1$, $30_2$ further includes a contact pad $32_1$, $32_2$. The contact pad $32_1$ of the first source conductor $30_1$ forms the first source node S1 or is electrically connected to the first source node S1. The contact pad $32_2$ of the second source conductor $30_2$ forms the second source node S2 or is electrically connected to the second source node S2. The semiconductor body 100 may be arranged in a housing H (illustrated in dashed lines in FIG. 8B). When the semiconductor body 100 is arranged in a housing, the contact pads $32_1$, $32_2$ are not directly accessible. In this case, the first source node S1 (the first load node of the load transistor T1) and the second source node S2 (the first load node of the sense transistor T2) are internal load nodes. Both the regulator $20_2$ (not shown in FIG. 8B) and the external load node S1' are connected to the contact pad $32_1$ of the first source conductor $30_1$. The external load S1' is accessible outside the housing and may be formed by a flat conductor 41 connected to the contact pad $32_1$ and protruding from the housing. This flat conductor 41 is represented by the resistor 41 shown in FIG. 2. Alternatively (not shown), the external load node S1' is formed by an electrically conducting leg protruding from the housing H and one or more bond wires connecting the leg to the contact pad $32_1$. Further legs or flat conductors protruding from the housing H and forming or being connected to the common gate node G and the common second load node D are not shown in FIG. 8B.

The regulator $20_2$ may be arranged inside the housing H and be connected to the internal load node S1 of the load transistor T1, that is, the contact pad $32_1$ of the first source conductor $30_1$, and to the first load node S2 of the sense transistor T2, that is, the contact pad $32_2$ of the second source conductor $30_2$, by conductors such as bond wires, flat conductors, or the like. A resistance of a conductor connecting the regulator $20_2$ to the internal load node S1 is negligible in view of the resistance of the source conductor $30_1$ because an input of the regulator $20_2$ connected to the internal load node S1 is high-ohmic so that the load current I1 does not flow via this conductor. The resistance of this conductor, therefore, does not contribute to the resistance of the first source conductor $30_1$. A resistance of the conductor connecting the contact pad $32_2$ of the second source conductor $30_2$ to the regulator $20_2$ does contribute to the resistance of the second source conductor $30_2$ as the sense current I2 flows through this conductor (and the regulator $20_2$). However, this electrical resistances is negligible as compared to electrical resistances of the metallization $31_2$, the contact pad $32_2$ and a conductor $33_2$ connecting the metallization $31_2$ with the contact pad $32_2$. The conductor $33_2$ may be arranged on the inactive region 130.

According to one example, the electrical resistance of the second source conductor $30_2$ is adjusted by adjusting the electrical resistance of the conductor $33_2$. Parameters of the conductor $33_2$ that may be varied in order to adjust the electrical resistance of the conductor $33_2$ include, but are not restricted to a length of the conductor $33_2$ between the metallization $31_2$ and the contact pad $32_2$; a cross section of the conductor $33_2$ in a direction perpendicular to a current flow direction; the material of the conductor $33_2$.

The desired resistance of the second source conductor 302 and, in particular, the desired resistance of the conductor $33_2$ in order to achieve a specific on-resistance of the sense transistor T2 as explained with reference to FIGS. 5 and 6 may be determined by simulating the transistor arrangement using a conventional design tool (design software) for semiconductor devices and/or by measuring samples of the transistor arrangement.

Figure 9:
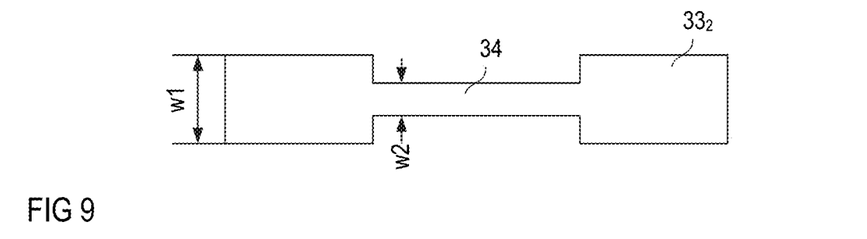
FIGS. 9 to 11 each illustrate examples of a conductor connecting the second source metallization with the second source pad.
Figure 10:
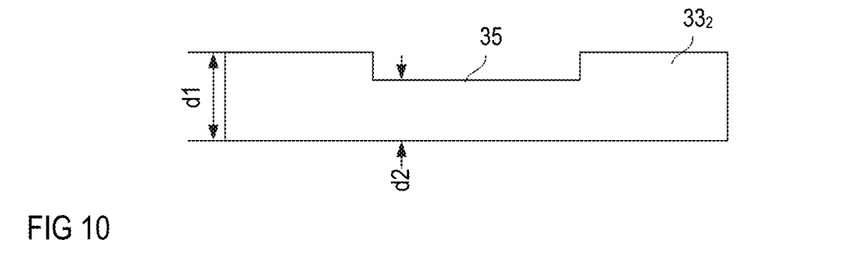
Figure 11:
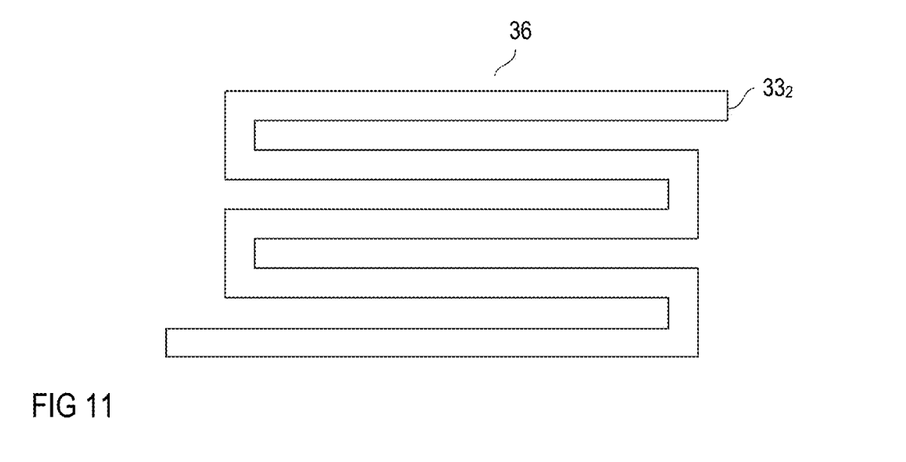

FIGS. 9 to 11 illustrate some specific examples of how the resistance of the conductor $33_2$ may be adjusted. FIG. 9 shows a top view of one section of the conductor $33_2$. In this example, the conductor $33_2$ has an essentially constant thickness (in a direction perpendicular to the drawing plane shown in FIG. 9) and a varying width in order to adjust the resistance. More specifically, in the example shown in FIG. 9, the conductor $33_2$ has a section 34 with a reduced width w2. That is, a width of the section 34 is smaller than a width w1 of sections adjoining the section 34 having the reduced width w2. Besides the width w2 of the section 34 a length 12 of the section 34 may be varied in order to adjust the resistance of the conductor $33_2$.

FIG. 10 shows a vertical cross sectional view of one section of a conductor $33_2$ according to one example. In this example, the conductor $33_2$ may have a constant width (in a direction perpendicular to the drawing plane illustrated in FIG. 10). Further, the conductor $33_2$ has a section 35 with a reduced thickness d2. That is, the thickness d2 of the section 35 is smaller than the thickness of adjoining sections.

FIG. 11 shows a top view of one section 36 of the conductor $33_2$ according to one example. In this example, the section 36 is meandering in order to increase the length of the conductor $33_2$. A width and a thickness of the conductor $33_2$ in the meandering section 36 may be constant.

It goes without saying that the measures illustrated in FIGS. 9 to 11 for adjusting the resistance of the conductor $33_2$ can be combined. That is, one conductor $33_2$ may include structures according to two or more of the examples illustrated in FIGS. 9 to 11 in order to adjust the resistance.

According to one example, the resistance of the conductor $33_2$ is in the range of between 2Ω (ohms) and 30Ω wherein the exact value is dependent on the specific type of transistor device, the proportionality factor $k_{ILIS}$ and the sizes of the first and second regions $A_1$, $A_2$. For example, the size of the active area, which is the size of the first region $A_1$ plus the size of the second region $A_2$ is 2 mm², the proportionality factor $k_{ILIS}$ is 30000 (3 E4), and the on-resistance $R_{ON1}$ of the load transistor T1 is 1.4 mΩ (milliohms). In order to achieve that the sense current I2 is $1/k_{ILIS}$ times the load current I1 the on-resistance $R_{ON2}$ of the sense transistor would have to be $k_{ILIS}$ times the on-resistance $R_{ON1}$ of the load transistor T1, that is 42Ω (=1.4 mΩ·30000). However, simulations and measurements of samples of this type of transistor arrangement have revealed that, due to current spreading effects, the on-resistance $R_{ON2}$ of the sense transistor T2 is only about 32Ω so that an additional resistance of 10Ω would be required. This additional resistor may be obtained by implementing the conductor $33_2$ as a trace made of AlCu (aluminum copper alloy) with a cross sectional area of 25.6 μm² (e.g., 8 μm wide and 3.2 μm high). A trace of this type has a resistance of 1Ω per millimeter so that the conductor $33_2$ may be implemented with a length of 10 millimeters to obtain a resistance of 10Ω.

Figure 12:
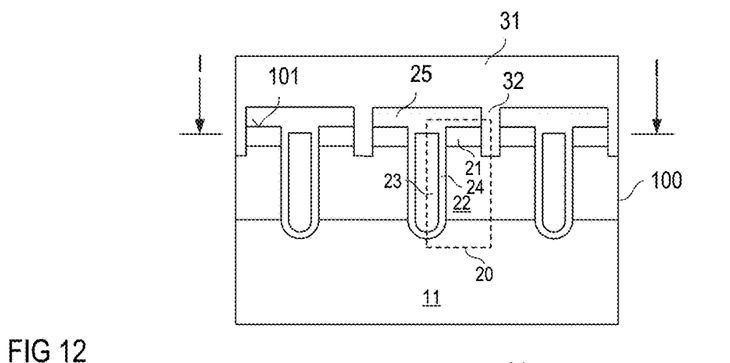
FIG. 12 illustrates a vertical cross sectional view of transistor cells according to one example that may be used in the load transistor or the sense transistor.

FIG. 12 schematically illustrates a cross sectional view of several transistor cells of the transistor arrangement. Transistor cells of the type illustrated in FIG. 12 may be used to implement the load transistor cells $20_1$ and the sense transistor cells $20_2$. Thus, reference character 20 in FIG. 12 represents an arbitrary one of the load transistor cells $20_1$ or sense transistor cells $20_2$. Referring to FIG. 12, one transistor cell 20 includes a body region 22 adjoining the drift and drain region 10. More specifically, the body region 22 adjoins the drift region 11. The body region 22 separates the drift region 11 from a source region 21. Further, a gate electrode 23 is adjacent the body region 22 and dielectrically insulated from the body region 22 by a gate dielectric 24. In a conventional fashion, the gate electrode 23 serves to control a conducting channel in the body region 22 between the source region 21 and the drift region 11. The source region 21 and the body region 22 of the transistor cell 20 are electrically connected to a metallization 31 that forms a part of the source conductor. The metallization 31 shown in FIG. 12 is the metallization $31_1$ of the first source conductor $30_1$ when the transistor cell 20 is a load transistor cell $20_1$, and the metallization 31 is the metallization $31_2$ of the second source conductor $30_2$ when the transistor cell 20 is a sense transistor cell $20_2$.

In the example shown in FIG. 12, the metallization 31 is electrically connected to the source region 21 and the body region 22 via a contact plug 32. This contact plug 32 is electrically (ohmically) connected to the source region 21 and the body region 22. Further, the metallization 31 is electrically insulated from the gate electrode 23 by an insulation layer 25. The gate electrode 23 is electrically connected to the common gate node G in a manner not illustrated in FIG. 12.

Figure 13:
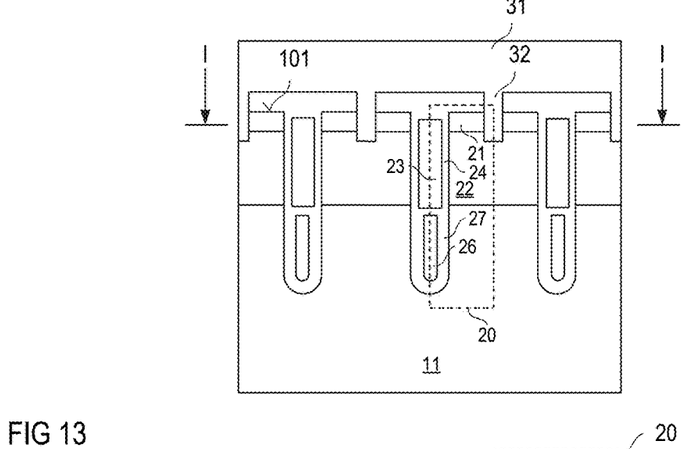
FIG. 13 illustrates a vertical cross sectional view of transistor cells according to another example that may be used in the load transistor or the sense transistor.

In a n-type MOSFET, the source region 21 is an n-type region and the body region 22 is a p-type region. In a p-type MOSFET, the source region 21 is a p-type region and the body region 22 is an n-type region FIG. 13 shows a modification of the transistor cell 20 shown in FIG. 12. The transistor cell 20 according to FIG. 13 additionally includes a field electrode 26 and a field electrode dielectric 27 that dielectrically insulates the field electrode 26 from the drift region 11. According to one example, the field electrode 26 is electrically connected to the source metallization 31. This connection, however, is not explicitly illustrated in FIG. 13.

The transistor cells 20 illustrated in FIGS. 12 and 13 are trench transistor cells. That is, the gate electrode 23 of each transistor cell 20 is arranged in a trench that extends from the surface 101 of the semiconductor body 100 into the semiconductor body 100. Implementing the transistor cells 20 as trench transistor cells, however, is only one example. According to another example, the transistor cells 20 are implemented as planar transistor cells, in which the gate electrode is arranged on top of the surface of the semiconductor body.

Figure 14:
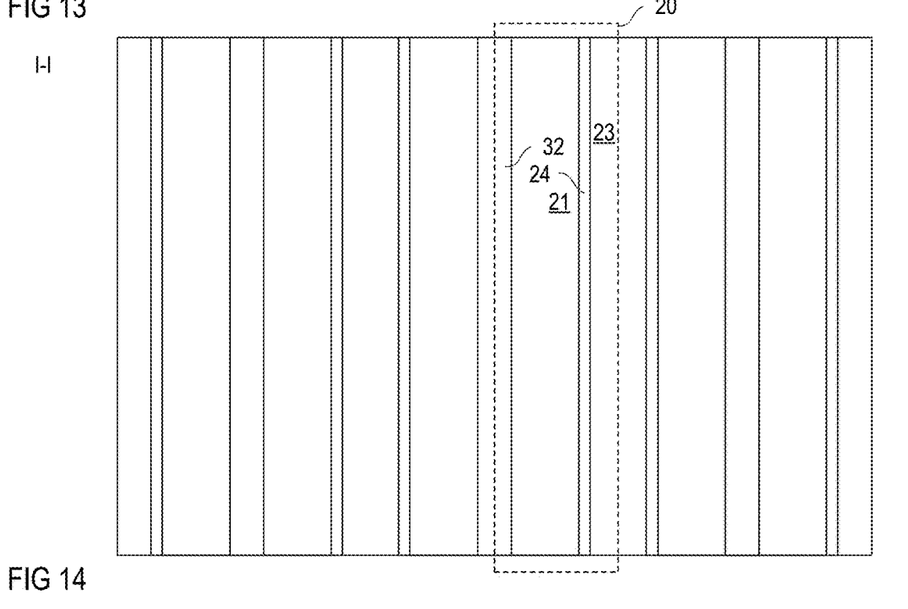
FIG. 14 shows one example of a horizontal cross sectional view of the transistor cells shown in FIG. 13 or 14.

FIG. 14 shows a horizontal cross sectional view of the transistor cells shown in FIG. 12 according to one example. In this example, the transistor cells are elongated transistor cells (stripe cells). That is, the gate electrodes 23, the source regions 21 and the body regions 22 are elongated in a horizontal direction of the semiconductor body 100. The "horizontal direction" is a direction parallel to the first surface 101.

Figure 15:
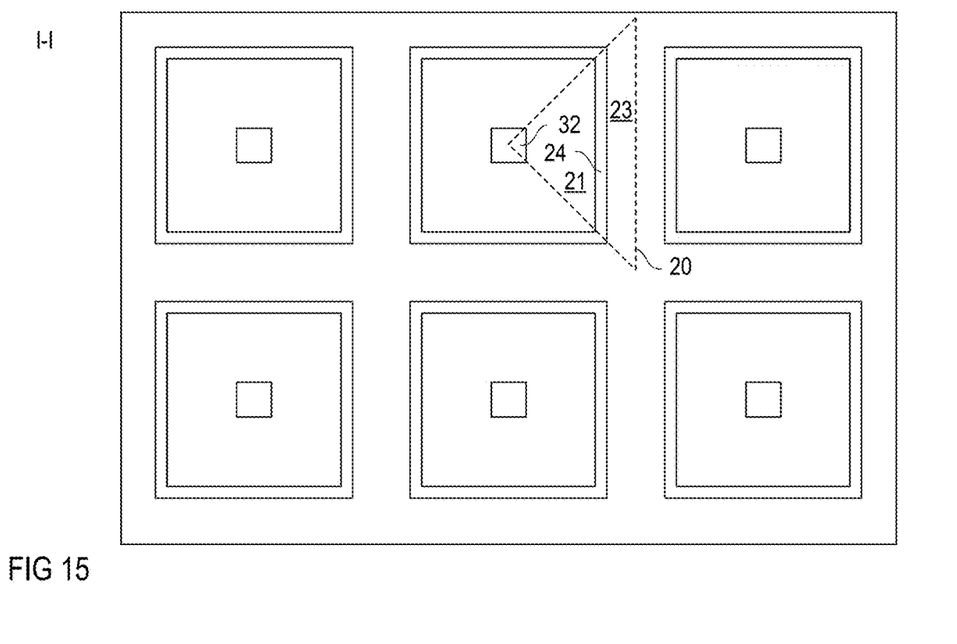
FIG. 15 shows another example of a horizontal cross sectional view of the transistor cells shown in FIG. 14 or 15.

FIG. 15 shows a horizontal cross sectional view of the transistor cells 20 according to another example. In this example, the gate electrode 23 has the shape of a rectangular grid that surrounds rectangular body regions (out of view in FIG. 15). The source region 21 has the form of a rectangular ring in this example. The individual transistor cells 20 can be considered as triangular transistor cells in this example. Implementing the gate electrode as a rectangular grid is only one example. A grid shaped gate electrode 23 may be implemented with other geometries, such as a hexagon, a pentagon, or the like.

Figure 16:
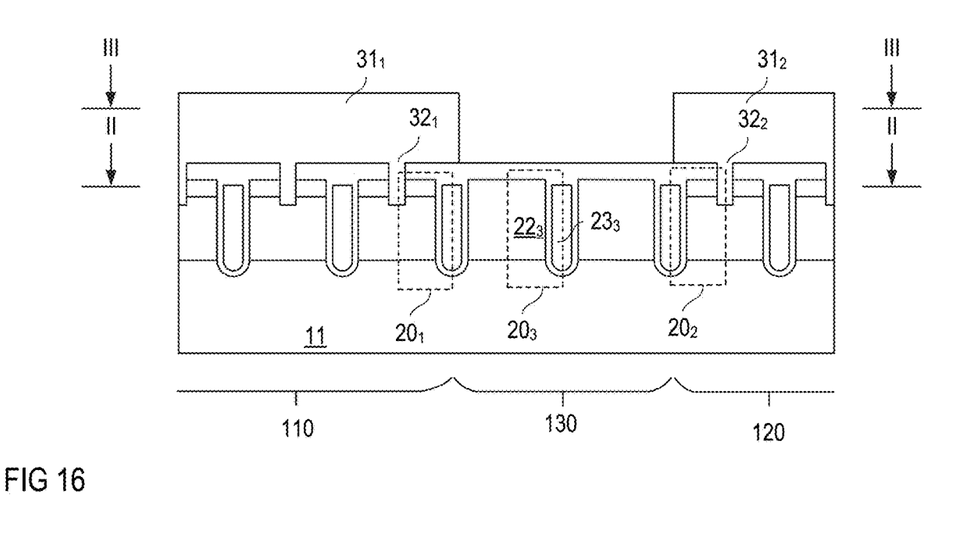
FIG. 16 shows one example of how an inactive region between the first active region and the second active region may be implemented.

FIG. 16 shows a vertical cross sectional view of the inactive region 130 according to one example. In this example, the inactive region 130 includes inactive transistor cells 203. These inactive transistor cells include a gate electrode 233. This gate electrode may be electrically connected with the gate electrodes of the load transistor cells $20_1$ and the sense transistor cells $20_2$. The inactive transistor cells 203 include body regions but $22_3$ do not include source regions. For the purpose of illustration, load transistor cells $20_1$ and sense transistor cells $20_2$ integrated in those regions of the first region 110 and the second region 120 adjoining the inactive region 130 are also illustrated in FIG. 16. Just for the purpose of illustration, these transistor cells $20_1$, $20_2$ are implemented as explained with reference to FIG. 12. This, however, is only an example. The transistor cells $20_1$, $20_2$ may be implemented with other topologies as well.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor arrangement, comprising:
a drift and drain region arranged in a semiconductor body and each connected to a drain node;
a plurality of load transistor cells each comprising a source region integrated in a first region of the semiconductor body;
a plurality of sense transistor cells each comprising a source region integrated in a second region of the semiconductor body;
a first source node electrically connected to the source region of each of the plurality of the load transistor cells via a first source conductor; and
a second source node electrically connected to the source region of each of the plurality of the sense transistor cells via a second source conductor; and
wherein a resistance of the second source conductor is different from a resistance of the first source conductor,
wherein the second source conductor comprises:
a second source metallization connected to the source region of each transistor cell of the plurality of sense transistor cells;
a second source pad spaced apart from the second source metallization in a horizontal direction of the semiconductor body; and
a connection line electrically connecting the second source metallization with the second source pad,
wherein the connection line comprises an elongated span with a plurality of meanders,
wherein a direction of the connection line reverses at each meander.

2. The transistor arrangement of claim 1, wherein the elongated span comprises at least three of the meanders.

3. The transistor arrangement of claim 2, wherein the elongated span comprises at least four of the meanders.

4. The transistor arrangement of claim 1, wherein the elongated span comprises a plurality of spans that are oriented parallel to one another, and wherein each of the meanders form a transition in two of the spans that are oriented parallel to one another.

5. The transistor arrangement of claim 1, wherein at least three of the spans that are oriented parallel to one another have the same length.

6. The transistor arrangement of claim 1, wherein the elongated span has a constant width.

7. The transistor arrangement of claim 1, wherein the connection line further comprises a varying thickness section that comprises a section with a reduced thickness in comparison to adjoining sections.

8. The transistor arrangement of claim 1, wherein the connection line further comprises a varying width section that comprises a section with a reduced width in comparison to adjoining sections.

9. The transistor arrangement of claim 1, wherein the resistance of the second source conductor is between 2Ω and 30 Ω.

10. The transistor arrangement of claim 1, wherein the transistor arrangement further comprises an inactive region between the first region and the second region of the semiconductor body, and wherein the second source conductor is disposed over the inactive region.

11. A transistor arrangement, comprising:
a drift and drain region arranged in a semiconductor body and each connected to a drain node;
a plurality of load transistor cells each comprising a source region integrated in a first region of the semiconductor body;
a plurality of sense transistor cells each comprising a source region integrated in a second region of the semiconductor body;
an inactive region between the first region and the second region of the semiconductor body;
a first source node electrically connected to the source region of each of the plurality of the load transistor cells via a first source conductor; and
a second source node electrically connected to the source region of each of the plurality of the sense transistor cells via a second source conductor;
wherein a resistance of the second source conductor is different from a resistance of the first source conductor, and
wherein the second source conductor comprises:
a second source metallization connected to the source region of each transistor cell of the plurality of sense transistor cells;

a second source pad spaced apart from the second source metallization in a horizontal direction of the semiconductor body; and a connection line arranged on the inactive region of the semiconductor body and electrically connecting the second source metallization with the second source pad, wherein the connection line comprises an elongated span with a plurality of meanders, wherein a direction of the connection line reverses at each meander.

12. The transistor arrangement of claim 11, wherein the elongated span comprises at least three of the meanders.

13. The transistor arrangement of claim 12, wherein the elongated span comprises at least four of the meanders.

14. The transistor arrangement of claim 11, wherein the elongated span comprises a plurality of spans that are oriented parallel to one another, and wherein each of the meanders form a transition in two of the spans that are oriented parallel to one another.

15. The transistor arrangement of claim 11, wherein at least three of the spans that are oriented parallel to one another have the same length.

16. The transistor arrangement of claim 11, wherein the elongated span has a constant width.

17. The transistor arrangement of claim 11, wherein the connection line further comprises a varying thickness section that comprises a section with a reduced thickness in comparison to adjoining sections.

18. The transistor arrangement of claim 11, wherein the connection line further comprises a varying width section that comprises a section with a reduced width in comparison to adjoining sections.

19. The transistor arrangement of claim 11, wherein the resistance of the second source conductor is between 2Ω and 30 Ω.

* * * * *